United States Patent
Lin et al.

(10) Patent No.: US 6,779,126 B1
(45) Date of Patent: Aug. 17, 2004

(54) PHASE DETECTOR FOR ALL-DIGITAL PHASE LOCKED AND DELAY LOCKED LOOPS

(75) Inventors: Feng Lin, Boise, ID (US); R. Jacob Baker, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 450 days.

(21) Appl. No.: 09/652,364

(22) Filed: Aug. 31, 2000

(51) Int. Cl.[7] .............................................. G06F 1/04
(52) U.S. Cl. .................. 713/500; 713/400; 713/502; 713/503; 713/600; 327/147; 327/156; 327/160; 327/166
(58) Field of Search ................................ 713/500, 400, 713/502, 503, 600; 327/147, 156, 160, 166

(56) References Cited

U.S. PATENT DOCUMENTS

| | | | | |
|---|---|---|---|---|
| 3,989,931 A | * | 11/1976 | Phillips | 377/43 |
| 4,682,343 A | * | 7/1987 | Pfiffner | 375/295 |
| 5,233,314 A | * | 8/1993 | McDermott et al. | 331/17 |
| 5,285,114 A | * | 2/1994 | Atriss et al. | 327/306 |
| 5,375,148 A | * | 12/1994 | Parker et al. | 375/376 |
| 5,446,867 A | * | 8/1995 | Young et al. | 713/503 |
| 5,473,285 A | * | 12/1995 | Nuckolls et al. | 331/1 A |
| 5,544,203 A | | 8/1996 | Casasanta et al. | |
| 5,646,564 A | * | 7/1997 | Erickson et al. | 327/158 |
| 5,659,263 A | * | 8/1997 | Dow et al. | 327/356 |
| 5,673,130 A | * | 9/1997 | Sundstrom et al. | 398/154 |
| 5,815,041 A | * | 9/1998 | Lee et al. | 331/8 |
| 5,844,954 A | | 12/1998 | Casasanta et al. | |
| 5,970,106 A | | 10/1999 | Izumikawa | |
| 6,005,425 A | * | 12/1999 | Cho | 327/156 |
| 6,078,634 A | * | 6/2000 | Bosshart | 375/376 |
| 6,087,868 A | * | 7/2000 | Millar | 327/156 |
| 6,211,743 B1 | * | 4/2001 | Rhee et al. | 331/34 |
| 6,337,590 B1 | * | 1/2002 | Millar | 327/158 |
| 6,346,839 B1 | * | 2/2002 | Mnich | 327/158 |

* cited by examiner

*Primary Examiner*—Jeffrey Gaffin
*Assistant Examiner*—N Patel
(74) *Attorney, Agent, or Firm*—Thorp Reed & Armstrong, LLP

(57) ABSTRACT

A phase detector is comprised of two cross-coupled gates which are capable of phase discrimination down to a level of approximately 10 picoseconds. An arbiter circuit, responsive to the cross-coupled gates, generates mutually exclusive UP and DOWN pulse signals. The UP and DOWN pulse signals may be filtered and used to control the delay line of an all digital delay locked or phase locked loop. Methods of operation are also disclosed.

17 Claims, 7 Drawing Sheets

PHASE DETECTOR FOR ALL-DIGITAL PHASE LOCKED AND DELAY LOCKED LOOPS

BACKGROUND OF THE INVENTION

1. Field of the Invention

The present invention is directed to phase detectors and, more particularly, to phase locked and delay locked loops comprised of all digital components.

2. Description of the Background

A phase locked loop is a circuit designed to minimize the phase difference between two signals. When the phase difference approaches zero, or is within a specified tolerance, the phase of the two signals is said to be "locked". A delay locked loop is similar to a phase locked loop, but instead of producing an output signal which has the same phase as an input or reference signal, the delay locked loop passes a reference or input signal into a delay line, and the output of the delay line has some predefined phase delay with respect to the reference or input signal.

Phase locked loops (PLL's) and delay locked loops (DLL's) are widely used circuits where it is necessary to have two signals which have a known relationship to one another. For example, when transmitting information from a sending device to a receiving device, it is necessary to have the local clock of the receiving device in sync with the clock of the sending device so that the information can be reliably transmitted. A PLL may be used for that purpose. Both PLL's and DLL's have been used for a long period of time, and numerous analog examples of these circuits can be found in the literature and in many devices.

A phase detector is a very important part of a PLL or DLL. The phase detector is used to provide phase discrimination and generate a control signal which is then used to speed up or slow down the local signal so that a desired relationship between the local signal and the reference signal is obtained.

FIG. 1 illustrates an analog prior art circuit used to produce a control signal Vc which is input to a voltage controlled oscillator (not shown) or voltage controlled delay line (not shown) to either advance or retard the phase of output signal Vo. The output signal Vo produced by the voltage controlled oscillator or voltage controlled delay line is then fed back to the phase detector 10. The phase detector also receives a reference signal Vref. The phase detector may be implemented by an edge-triggered D-type flipflop or an RS latch. Those devices generate an UP/DOWN signal having a pulse width that is proportional to the phase difference between the two signals. The UP/DOWN signal can then be used to control a charge pump circuit 12. The output of the charge pump circuit 12 is fed into a loop filter 13, which integrates and generates the analog voltage Vc used to control the voltage controlled oscillator or voltage controlled delay line.

FIG. 2 illustrates the relationship between the signals Vref, Vo and the UP/DOWN signal of FIG. 1. FIG. 2 illustrates the situation when the loop is close to "lock." Under those conditions, the pulse width of the UP and DOWN signals is narrow.

PLL's and DLL's are used in a variety of devices where the PLL or DLL can be constructed of all digital components. The all-digital approach has the benefits of being portable and scalable for other processes and applications. For example, all digital implementations of PLL's and DLL's are needed for such complex circuits as memory devices. The system clock of certain types of memory devices needs to be in sync with, for example, data so that data may be reliably written to or read from the memory. PLL's and DLL's are also needed when transferring data within the memory device to insure, for example, that data read out of the memory is properly presented to output pads.

A problem occurs when traditional phase detectors are used for all digital PLL's and DLL's. For all digital loops, there is no integration of the UP/DOWN signal as occurs in analog loops. As a result, mutually exclusive signals are needed to control all digital loops. More specifically, the UP signal and DOWN signal cannot occur at the same time. Furthermore, the control signals need to be well-defined digital pulses even when the loop is close to "lock" to insure that the appropriate action is taken. Thus, the need exists for a phase detector suitable for use in all digital PLL's and DLL's which can reliably produce control signals even when the loop is close to locked conditions.

SUMMARY OF THE PRESENT INVENTION

The present invention is directed to a phase detector comprised of two cross-coupled logic gates for providing phase discrimination between a clock, or reference, signal and a feedback, or output, signal. A plurality of transistors are responsive to the logic gate for generating mutually exclusive UP and DOWN signals. A filter receives the UP and DOWN signals and produces control signals therefrom.

The present invention also directed to a method of discriminating between a local or chip clock signal and a reference clock signal to produce first and second signals which do not have coincident leading edges. The first and second signals are then filtered to produce first and second control signals, respectively.

The present invention provides a novel phase detector using a two-way arbiter designed to discriminate a small phase error and provide all the features required by an all digital loop. The phase detector of the present invention can detect phase error down to 10 pico-seconds and produce UP and DOWN signals having a pulse width equal to one-half of the cycle of the clock signals, regardless of how close the loop is to "lock." An n-bit counter, shift register, or other device provides noise filtering to select certain of the UP/DOWN signals to generate FAST and SLOW control signals to control the loop. The phase detector of the present invention provides for fast locking and stable operation of the loop with low jitter. Those, and other advantages and benefits, will be apparent from the Description of the Preferred Embodiment appearing hereinbelow.

BRIEF DESCRIPTION OF THE DRAWINGS

For the present invention to be easily understood and readily practiced, the present invention will now be described, for purposes of illustration and not limitation, in conjunction with the following figures, wherein.

DESCRIPTION OF THE PREFERRED EMBODIMENTS

Figure 1:
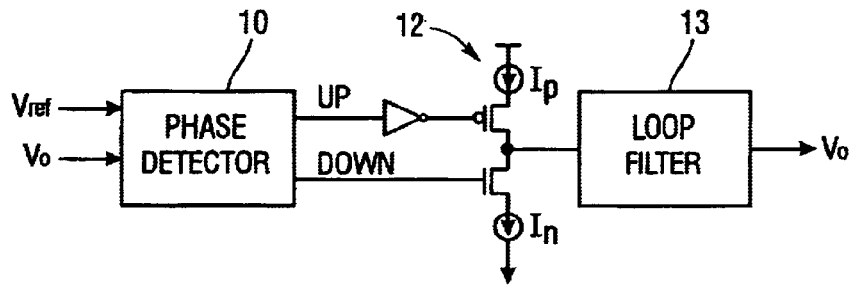
FIG. 1 illustrates a prior art phase detector in combination with a charge pump circuit used to generate the UP/DOWN control signals needed for a voltage controlled oscillator or voltage controlled delay line.
Figure 2:
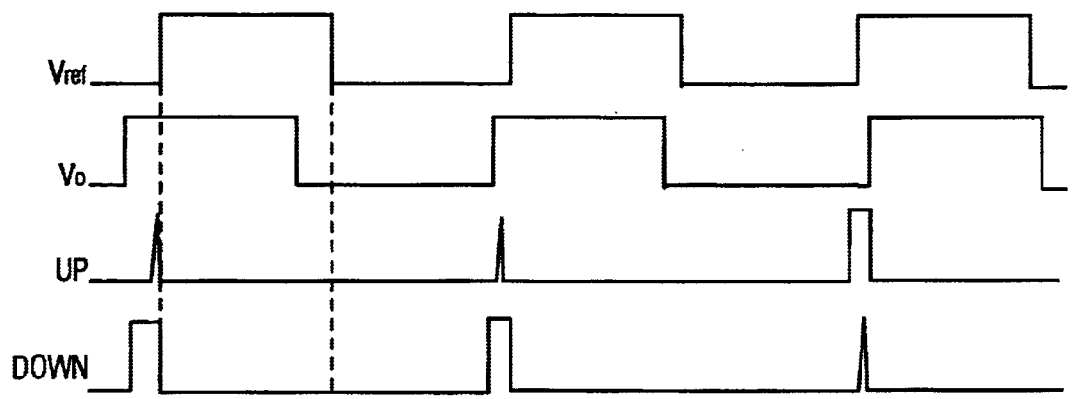
FIG. 2 illustrates signals helpful in understanding the operation of the circuit shown in FIG. 1.
Figure 3:
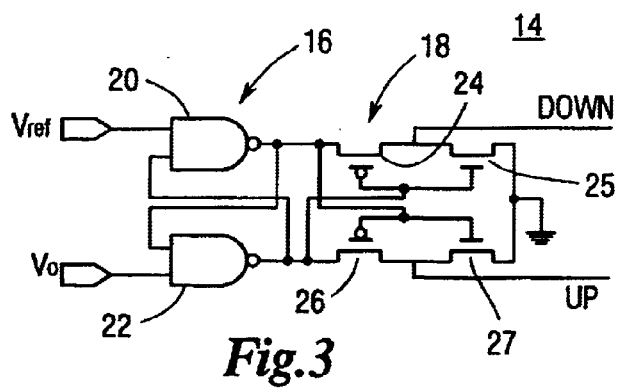
FIG. 3 illustrates a phase detector constructed according to the teachings of the present invention having a phase detector circuit and an arbiter circuit.

FIG. 3 illustrates a phase detector 14 constructed according to the teachings of the present invention. The phase detector 14 is comprised of a phase detector circuit 16 and an arbiter circuit 18. The phase detector circuit 16 is comprised of two cross-coupled NAND gates 20 and 22. Four transistors, two p-type 24, 26 and two n-type 25, 27, are connected to provide a two-way arbiter circuit 18. The arbiter circuit 18 produces the UP signal and DOWN signal in a manner such that at the rising edges, the UP signals and DOWN signals can never be high at the same time. Additionally, the width of the pulse for the "winning" signal, either UP or DOWN depending on current phase relationship, is at least equal to one-half of the cycle of the reference and output signals.

Figure 4:
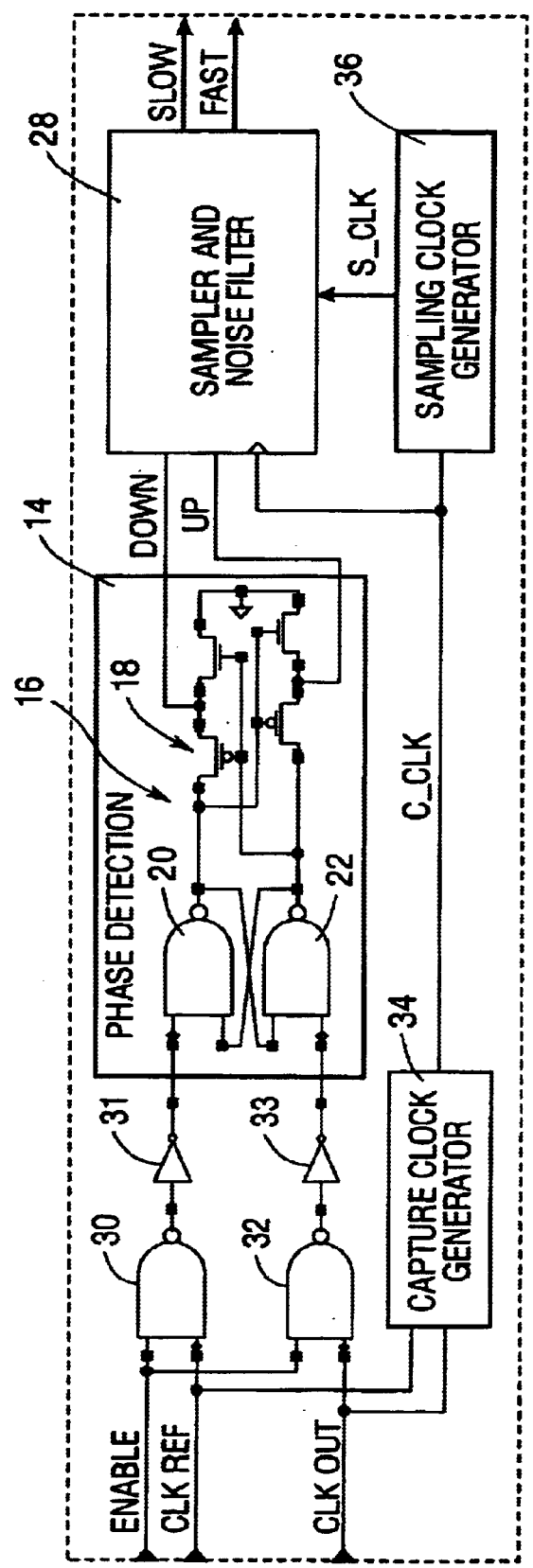
FIG. 4 illustrates a phase detector constructed according to the teachings of the present invention in combination with a sampler and noise filter.

Because the phase detector 14 of the present invention is very sensitive to small phase error, a sampling and noise filtering circuit is preferably added to provide stable operation. FIG. 4 illustrates a phase detector 14 constructed according to the teachings of the present invention in combination with a sampler and noise filter 28. In FIG. 4, the NAND gate 20 receives the reference signal, CLKREF through a NAND gate 30 and an inverter 31. Similarly, the signal produced by the locked loop, CLKOUT is input to the NAND gate 22 through a NAND gate 32 and an inverter 33. The NAND gates 30 and 32 also receive an enable signal which is used to enable the phase detector 14. The arbiter circuit 18 produces the DOWN and UP signals as described above in conjunction with FIG. 3 which are each input to the sampler and noise filter 28.

The remainder of the circuit shown in FIG. 4 is comprised of a capture clock generator 34 and a sampling clock generator 36. The capture clock generator 34 receives both the reference clock signal CLKREF and the signal produced by the locked loop, CLKOUT. The rising edge of the capture clock C_CLK is related to the "winner" of the arbiter circuit 18, either DOWN or UP according to the phase relationship of the signals CLKREF and CLKOUT. The capture clock is input to the sampler and noise filter 28 and to the sampling clock generator 36.

The sampling clock generator 36 produces a sampling clock signal S_CLK. The sampling clock signal S_CLK could be a delayed version of the capture clock signal C_CLK, or the frequency could be delayed (counted) down according to a particular application. Note, however, that both the signals C_CLK and S_CLK have similar pulse widths.

As will be explained more fully in conjunction with FIG. 7 the capture clock signal C_CLK is to admit (capture) certain of the UP and DOWN pulses produced by the arbiter circuit 18. The sampling clock enable signal C_CLK allows only a certain number of DOWN/UP pulses to be output as SLOW and FAST control signals, respectively. In that manner, stable operation of the locked loop can be obtained. Furthermore, because the phase detector 14 is so sensitive, the sampler and noise filter 28 and related components which produce the capture clock signals and sample clock signals allow for quicker locking by eliminating "hunting" (overshooting and undershooting phase lock) which can result from a phase detector which is sensitive to very small phase error.

Figure 5:
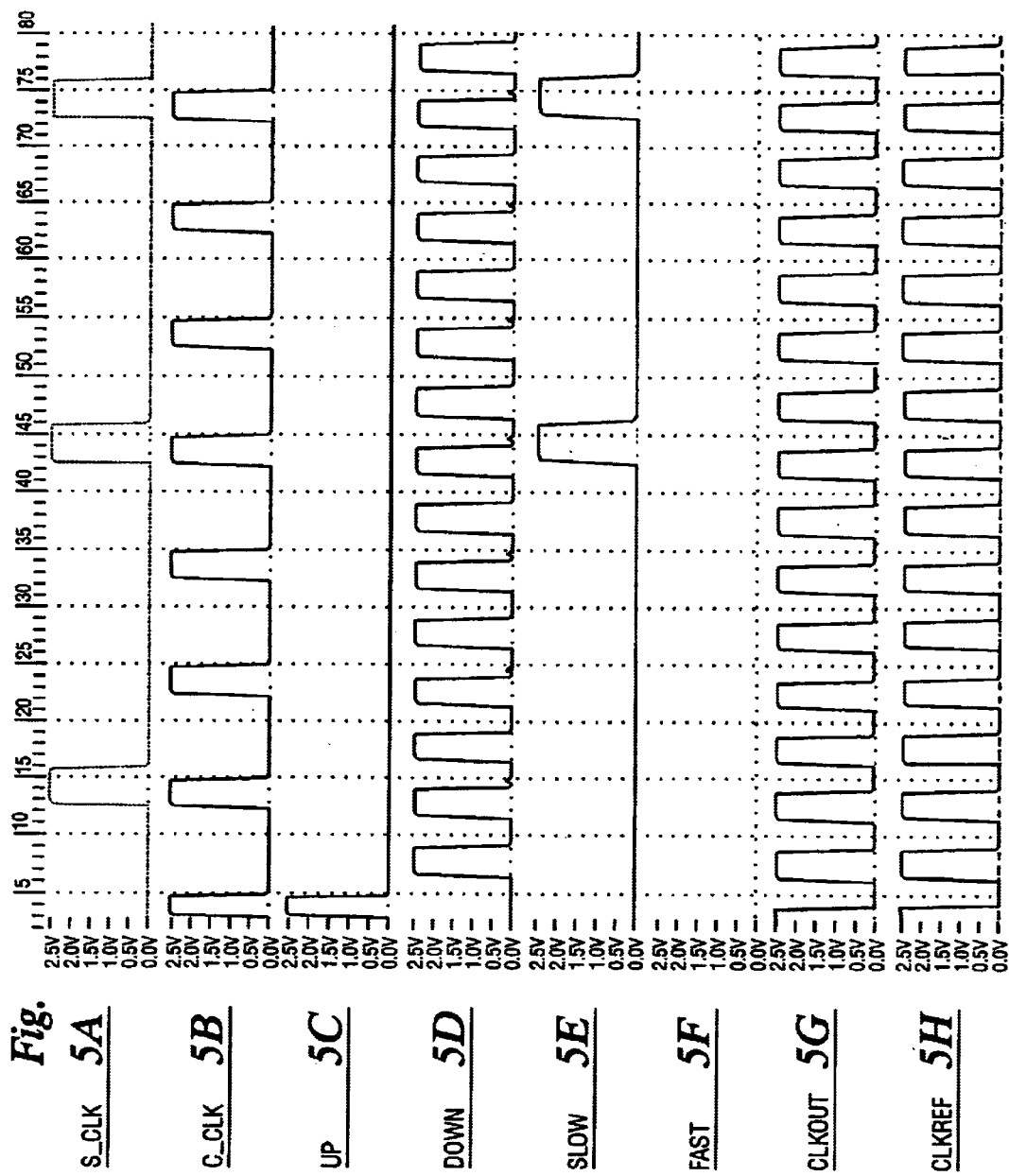
FIGS. 5A–5H and 6A–6H are timing diagrams illustrating signals helpful in understanding the operation of the circuit shown in FIG. 4.
Figure 6:
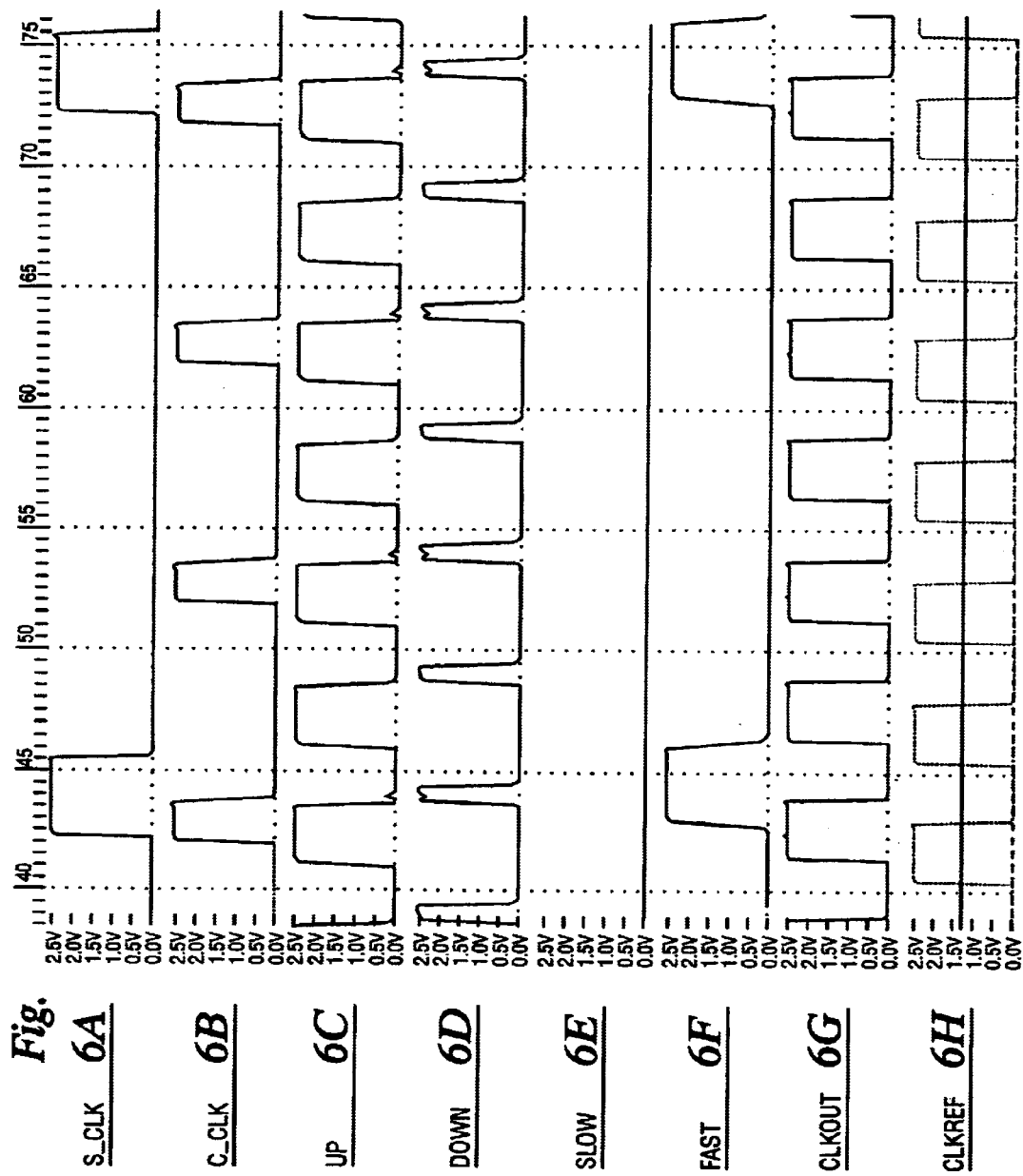

Simulations run on the circuit of FIG. 4 at 200 megahertz and room temperature produced the signals illustrated in FIGS. 5A–5H. In the simulations, the frequency of the capture clock signal C_CLK is one half the frequency of the reference clock signal CLKREF, while the frequency of the sampling clock S_CLK is one-sixth of the reference clock signal CLKREF. FIGS. 5A and 5B illustrate the sampling clock signal S_CLK and the capture clock signal C_CLK, respectively. FIGS. 5C and 5D illustrate the UP and DOWN signals, respectively, produced by the arbiter circuit 18. FIGS. 5E and 5F illustrate the SLOW and FAST control signals, respectively, produced by the device shown in FIG. 4. As can be seen, the leading edges of the signals shown in FIGS. 5C and 5D are mutually exclusive. Also, as a result of the capture clock signal C_CLK and the sampling clock signal S_CLK the number of pulses in the UP and DOWN signals is reduced to produce the FAST and SLOW control signals, respectively. It can also be seen that the pulse width of the FAST and SLOW control signals is of a sufficient magnitude to provide a stable signal even though the signal CLKOUT and CLKREF are close to lock. It is thus seen that the circuit of FIG. 4 provides signals capable of stable operation even when the loop is close to locking.

FIGS. 6A–6H illustrate signals similar to 5A–5H, respectively, except that the phase difference between the signals CLKOUT and CLKREF is large.

Figure 7:
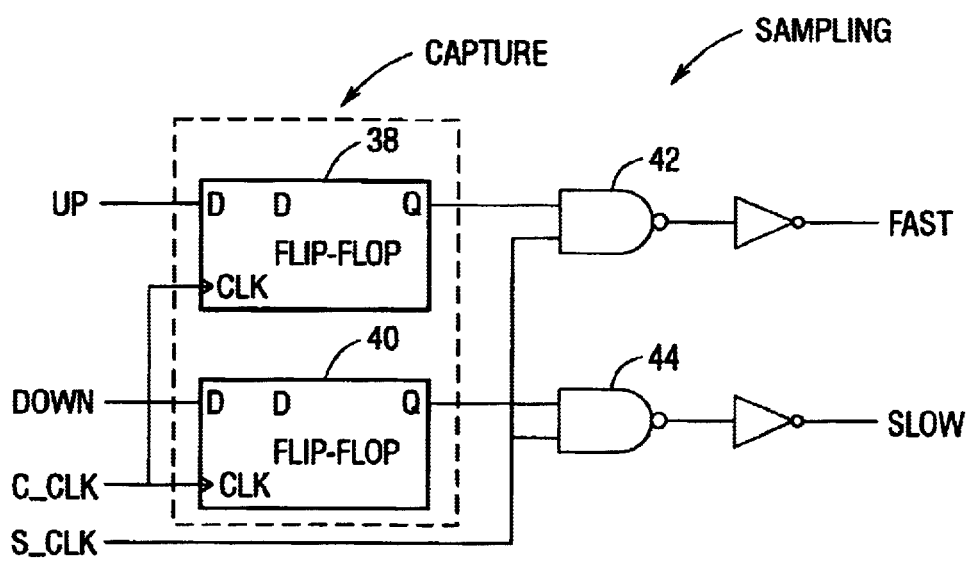
FIG. 7 is a diagram illustrating the sampler and noise filter of FIG. 4.

In FIG. 7, a circuit for implementing one embodiment of the sampler and noise filter 28 is illustrated. The UP signal is received by a D-type flip-flop 38 while the DOWN signal is received by another D-type flip-flop 40. Each of the flip-flops 38, 40 is clocked by the capture clock signal C_CLK. The capture function is thus performed by the flip-flops 38, 40. The output of the flip-flop 38 is input to a NAND gate 42 while the output of the flip-flop 40 is input to an NAND gate 42. The NAND gates 42, 44 are clocked by the sample clock signal S_CLK to produce the FAST control signal and the SLOW control signal, respectively. In that manner, the number of pulses comprising the control signals is reduced from the number of pulses comprising the UP and DOWN signals to enable the loop to lock faster and to provide for stable operation.

Figure 8:
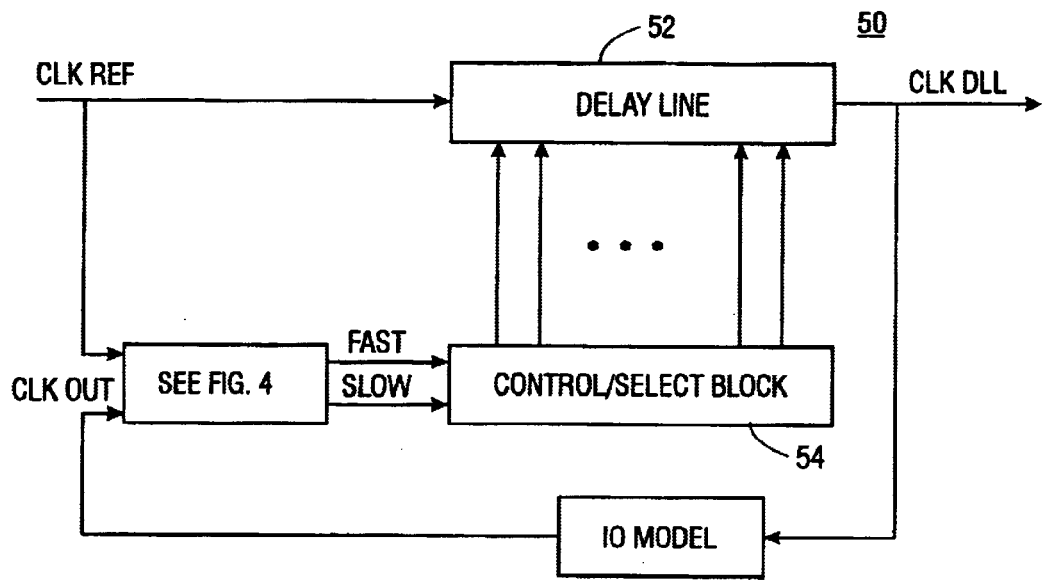
FIG. 8 illustrates a DLL in which the circuit of FIG. 4 may be used.

FIG. 8 illustrates one embodiment of a delay locked loop 50 in which the FAST and SLOW control signals may be used to determine the number of delay stages (not shown) within a delay line 52 that are active to produce the output signal CLKDLL. The FAST and SLOW signals are input to a control/select block 54 that produces signals for controlling whether a delay stage within delay line 52 is active or inactive.

Figure 9:
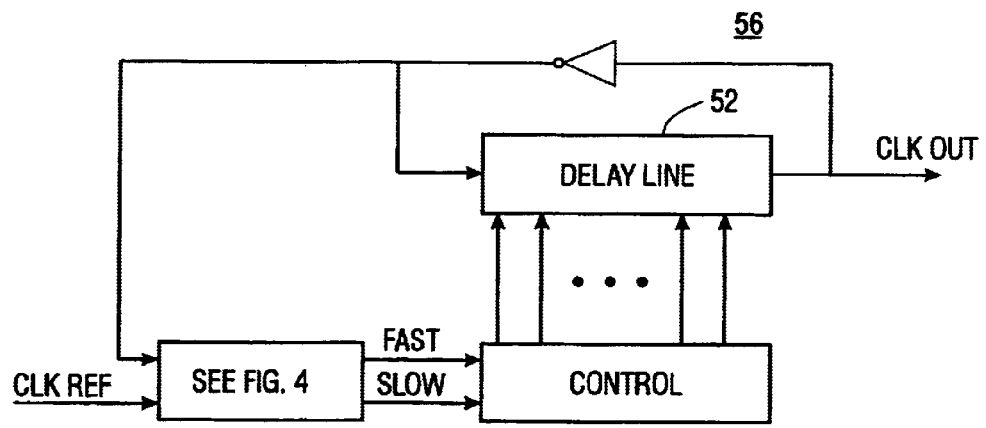
FIG. 9 illustrates a PLL in which the circuit of FIG. 4 may be used.

FIG. 9 illustrates an all-digital PLL 56 in which the circuit of FIG. 4 may be used to produce FAST and SLOW signals to control the delay line 52.

Figure 10:
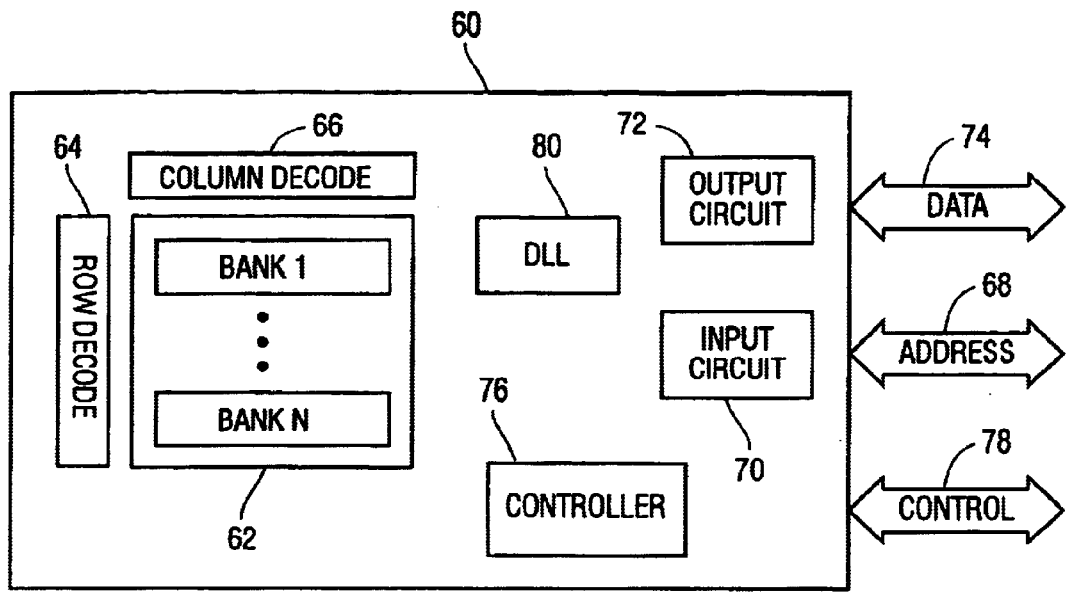
FIG. 10 is a block diagram of a memory device in which a DLL having a phase detector constructed according to the teachings of the present invention may be used.

FIG. 10 illustrates a memory device 60 which includes, by way of example and not limitation, a synchronous dynamic random access memory device (SDRAM). As shown in FIG. 10, memory device 60 includes a main memory 62. Main memory 62 typically includes dynamic random access memory (DRAM) devices which include one or more memory banks, indicated by BANK 1–BANK N. Each of the memory banks BANK 1–N includes a plurality of memory cells arranged in rows and columns. Row decode 64 and column decode 66 access the rows and columns in response to an address, provided on address bus 68 by an external controller (not shown), such as a microprocessor. An input circuit 70 and an output circuit 72 connect to a data bus 74 for bi-directional data communication with main memory 62. A memory controller 76 controls data communication between the memory 60 and external devices by responding to an input clock signal (CLK) and control signals provided on control lines 78. The control signals include, but are not limited to, Chip Select (CS*), Row Access Strobe (RAS*), Column Access Strobe (CAS*), Write Enable (WE*), and Clock Enable (CKE).

As shown in FIG. 10, DLL 80, formed according to the teaching of the present invention, connects to input circuit 70 and output circuit 72 for performing a timing adjustment, such as skew elimination or clock synchronization between two clock signals. According to the teachings of the present invention DLL 80 is an all digital loop. Those skilled in the art will readily recognize that the DRAM device 60 of FIG. 10 is simplified to illustrate the present invention and is not intended to be a detailed description of all of the features of a DRAM device. The reader should also recognize that the illustration of memory device 60 is merely for purposes of illustrating one application for the present invention and should not be taken as limiting the applicability of the present invention to other applications.

Figure 11:
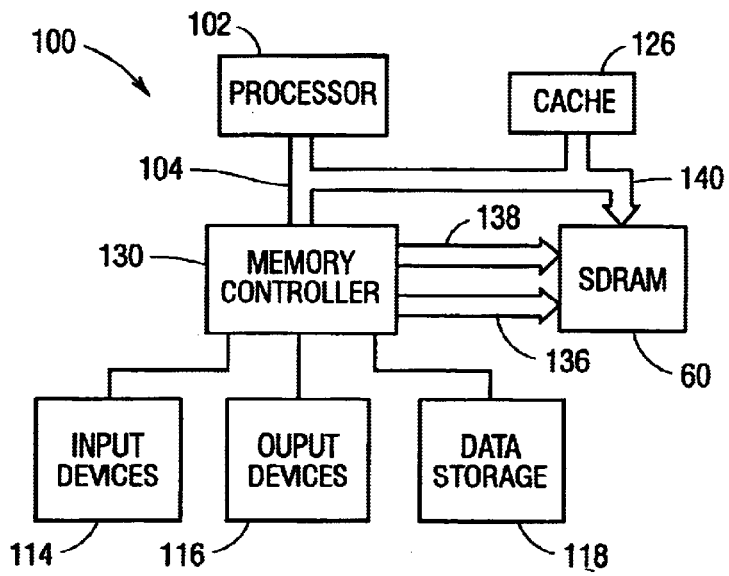
FIG. 11 is a block diagram of a computer system in which the present invention may be used.

FIG. 11 illustrates a computer system 100 containing the SDRAM 60 of FIG. 10 using the phase detector according to the invention. The computer system 100 includes a processor 102 for performing various computing functions, such as executing specific software to perform specific calculations or tasks. The processor 102 includes a processor bus 104 that normally includes an address bus, a control bus and a data bus. In addition, the computer system 100 includes one or more input devices 114, such as a keyboard or a mouse, coupled to the processor 102 to allow an operator to interface with the computer system 100. Typically, the computer system 100 also includes one or more output devices 116 coupled to the processor 102, such output devices typically being a printer or a video terminal. One or more data storage devices 118 are also typically coupled to the processor 102 to allow the processor 102 to store data in or retrieve data from internal or external storage media (not shown). Examples of typical storage devices 118 include hard and floppy disks, tape cassettes, and the compact disk read-only memories (CD-ROMs). The processor 102 is also typically coupled to cache memory 126, which is usually static random access memory ("SRAM") and to the SDRAM 60 through a memory controller 130. The memory controller 130 normally includes a control bus 136 and an address bus 138 that are coupled to the SDRAM 60. A data bus 140 may be coupled to the processor bus 104 either directly (as shown), through the memory controller 130, or by some other means.

While the present invention has been described in connection with exemplary embodiments thereof, those of ordinary skill in the art will recognize that many modifications and variations are possible. Such modifications and variations are intended to be within the scope of the present invention, which is limited only by the following claims.

What is claimed is:

1. A phase detector, comprising:
   two cross-coupled logic gates for providing phase discrimination between a reference signal and a feedback signal;
   a plurality of transistors, responsive to said logic gates, for generating mutually exclusive UP and DOWN pulse signals; and
   a circuit for reducing the number of pulses in said UP and DOWN signals to produce FAST and SLOW control signal, respectively.

2. The phase detector of claim 1 wherein said logic gates included NAND gates.

3. The phase detector of claim 1 wherein said circuit is responsive to a capture clock signal for capturing said UP and DOWN signals and a sampling clock signal for sampling the captured UP and DOWN signals for producing said FAST and SLOW signals.

4. The phase detector of claim 1 wherein said phase detector is capable of phase discrimination down to approximately ten picoseconds.

5. A locked loop comprised of all digital components, comprising:
   a delay line producing a local clock signal, said delay line being responsive to FAST and SLOW control signals for advancing and retarding, respectively, the phase of the local clock signal;
   a phase detector circuit for comparing the phase of a reference clock signal and the local clock signal;
   an arbiter circuit responsive to said phase detector circuit, for generating mutually exclusive UP and DOWN pulse signals; and
   a circuit for reducing the number of pulses in said UP and DOWN signals for producing FAST and SLOW control signals, respectively.

6. The locked loop of claim 5 wherein said phase detector circuit is comprised of two cross-coupled logic gates.

7. The locked loop of claim 5 wherein said circuit is responsive to a capture clock signal for capturing said UP and DOWN signals and a sampling clock signal for sampling the captured signals for producing said FAST and SLOW control signals, respectively.

8. The locked loop of claim 5 wherein said phase detector is capable of discriminating a phase difference between said local clock signal and a reference clock signal of approximately ten picoseconds.

9. A method of producing control pulses, comprising:
   comparing the phase of a local clock signal and a reference clock signal;
   producing, in response to said comparing, UP and DOWN pulse signals having mutually exclusive leading edges; and
   reducing the number of pulses in said UP and DOWN signals to produce FAST and SLOW control signals, respectively.

10. The method of claim 9 wherein the width of the pulses comprising the UP and DOWN pulse signals is representative of the difference in phase between the local clock signal and the reference clock signal.

11. The method of claim 9 wherein said comparing includes discriminating to a level of approximately ten picoseconds phase differences between the local clock signal and the reference clock signal.

12. The method of claim 9 wherein said reducing includes capturing certain pulses of said UP and DOWN pulse signals, and sampling said captured pulses to produce FAST and SLOW control signals, respectively.

13. The method of claim 9 wherein said reducing includes filtering.

14. A method of operating a locked loop, comprising:
    comparing the phase of a feedback clock signal and a reference clock signal;
    producing, in response to said comparing, UP and DOWN pulse signals having mutually exclusive leading edges;
    reducing the number of pulses in said UP and DOWN signals to produce control signals; and
    controlling a delay line with said control signals to produce said feedback clock signal.

15. The method of claim 14 wherein said reducing includes capturing certain pulses of said UP and DOWN pulse signals, and sampling said captured pulses to produce FAST and SLOW control signals, respectively.

16. The method of claim 14 wherein said comparing includes discriminating to a level of approximately ten picoseconds phase differences between a feedback clock signal and a reference clock signal.

17. The method of claim 14 wherein said reducing includes filtering.

* * * * *

UNITED STATES PATENT AND TRADEMARK OFFICE
CERTIFICATE OF CORRECTION

PATENT NO.   : 6,779,126 B1
DATED        : October 21, 2004
INVENTOR(S)  : Lin et al.

It is certified that error appears in the above-identified patent and that said Letters Patent is hereby corrected as shown below:

Column 2,
Line 28, after "invention" insert -- is --.

Column 3,
Line 62, delete "delayed" and insert therefore -- divided --.

Column 4,
Line 48, delete "42" first occurrence and insert therefore -- 44 --.

Column 6,
Line 11, delete "signal," and insert therefore -- signals, --.

Signed and Sealed this

Fourteenth Day of December, 2004

JON W. DUDAS
*Director of the United States Patent and Trademark Office*